United States Patent
Yumoto et al.

(10) Patent No.: US 9,276,099 B2
(45) Date of Patent: Mar. 1, 2016

(54) SEMICONDUCTOR DEVICE

(75) Inventors: Miki Yumoto, Kanagawa (JP);
Masahiko Kuraguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 848 days.

(21) Appl. No.: 13/415,926

(22) Filed: Mar. 9, 2012

(65) Prior Publication Data

US 2012/0161153 A1    Jun. 28, 2012

Related U.S. Application Data

(63) Continuation of application No. PCT/JP2009/004981, filed on Sep. 29, 2009.

(51) Int. Cl.
*H01L 29/15* (2006.01)
*H01L 31/0256* (2006.01)
*H01L 29/778* (2006.01)
*H01L 29/423* (2006.01)
*H01L 29/51* (2006.01)
*H01L 29/66* (2006.01)
*H01L 29/20* (2006.01)

(52) U.S. Cl.
CPC ........ *H01L 29/7786* (2013.01); *H01L 29/4236* (2013.01); *H01L 29/513* (2013.01); *H01L 29/66462* (2013.01); *H01L 29/2003* (2013.01); *H01L 29/42364* (2013.01)

(58) Field of Classification Search
CPC .............. H01L 29/778; H01L 29/7787; H01L 29/66462; H01L 29/2003
USPC ..................... 257/76, 192, 194, 200
See application file for complete search history.

(56) References Cited

U.S. PATENT DOCUMENTS

| | | | |
|---|---|---|---|
| 7,528,423 B2 | 5/2009 | Ueno et al. | |
| 2003/0020092 A1* | 1/2003 | Parikh et al. | 257/192 |
| 2005/0145883 A1* | 7/2005 | Beach et al. | 257/194 |
| 2006/0157729 A1 | 7/2006 | Ueno et al. | |

(Continued)

FOREIGN PATENT DOCUMENTS

| | | |
|---|---|---|
| JP | 2002-324813 | 11/2002 |
| JP | 2008-141040 | 6/2006 |

(Continued)

OTHER PUBLICATIONS

Office Action issued Oct. 1, 2013 in Japanese Patent Application No. 2011-533948 with English language translation.

(Continued)

*Primary Examiner* — Zandra Smith
*Assistant Examiner* — John M Parker
(74) *Attorney, Agent, or Firm* — Oblon, McClelland, Maier & Neustadt, L.L.P.

(57) ABSTRACT

A semiconductor device of one embodiment, including the semiconductor layer including a III-V group nitride semiconductor; a groove portion formed in the semiconductor layer; the gate insulating film formed at least on a bottom surface of the groove portion, the gate insulating film being a stacked film of a first insulating film and a second insulating film of which dielectric constant is higher than that of the first insulating film; the gate electrode formed on the gate insulating film; and a source electrode and a drain electrode formed on the semiconductor layer across the gate electrode, in which the second insulating film is selectively formed only under the gate electrode.

6 Claims, 7 Drawing Sheets

(56) References Cited

U.S. PATENT DOCUMENTS

| | | | |
|---|---|---|---|
| 2007/0018199 A1* | 1/2007 | Sheppard et al. | 257/200 |
| 2007/0026587 A1 | 2/2007 | Briere | |
| 2007/0045670 A1 | 3/2007 | Kuraguchi | |
| 2008/0006845 A1* | 1/2008 | Derluyn et al. | 257/192 |
| 2008/0093626 A1 | 4/2008 | Kuraguchi | |
| 2008/0203433 A1* | 8/2008 | Sato | 257/192 |
| 2008/0203541 A1 | 8/2008 | Makiyama | |
| 2008/0237605 A1 | 10/2008 | Murata et al. | |
| 2008/0258243 A1 | 10/2008 | Kuroda et al. | |
| 2008/0283870 A1 | 11/2008 | Sato | |
| 2010/0090225 A1* | 4/2010 | Sato | 257/76 |

FOREIGN PATENT DOCUMENTS

| | | |
|---|---|---|
| JP | 2006-222414 | 8/2006 |
| JP | 2008-270521 | 11/2006 |
| JP | 2007-67240 | 3/2007 |
| JP | 2007-81346 | 3/2007 |
| JP | 2008-103617 | 5/2008 |
| JP | 2008-205392 | 9/2008 |
| JP | 2008-270794 | 11/2008 |
| JP | 2008-288405 | 11/2008 |
| JP | 2008-306058 | 12/2008 |
| JP | 2009-4743 | 1/2009 |
| WO | WO 2007/016477 A2 | 2/2007 |

OTHER PUBLICATIONS

International Search Report mailed Dec. 22, 2009 in PCT/JP2009/004981 filed Sep. 29, 2009 (in English).

* cited by examiner

US 9,276,099 B2

SEMICONDUCTOR DEVICE

CROSS-REFERENCE TO RELATED APPLICATION

This application is continuation application based upon the International Application PCT/JP2009/004981, the International Filing Date of which is Sep. 29, 2009, the entire content of which is incorporated herein by reference.

FIELD

Embodiments described herein relate generally to a semiconductor device.

BACKGROUND

Recently, in order to realize a power semiconductor device such as a switching device and a high-frequency power semiconductor device, a nitride semiconductor material having high critical field strength is actively researched. JP-A 2006-222414 (KOKAI) discloses a heterojunction field-effect transistor having a recess structure in a gate electrode forming region. A gate insulating film of the transistor is stacked film made of a silicon nitride film and a high-dielectric-constant insulating film. The structure intended to realize normally-off operation and to improve transconductance in a nitride-based semiconductor device.

DETAILED DESCRIPTION

The semiconductor device of an embodiment includes a semiconductor layer including a III-V group nitride semiconductor; a groove portion formed in the semiconductor layer; a gate insulating film formed at least on a bottom surface of the groove portion, the gate insulating film being a stacked film of a first insulating film and a second insulating film of which dielectric constant is higher than that of the first insulating film; a gate electrode formed on the gate insulating film; and a source electrode and a drain electrode formed on the semiconductor layer across the gate electrode, in which the second insulating film is selectively formed only under the gate electrode.

First Embodiment

A semiconductor device of this embodiment includes a semiconductor layer including a III-V group nitride semiconductor, a groove portion formed in the semiconductor layer, a gate insulating film formed at least on a bottom surface of the groove portion, the gate insulating film being a stacked film of a first insulating film and a second insulating film of which dielectric constant is higher than that of the first insulating film, a gate electrode formed on the gate insulating film, and a source electrode and a drain electrode formed on the semiconductor layer across the gate electrode. The second insulating film is selectively formed only under the gate electrode. Further, a third insulating film is formed between a surface of the semiconductor layer other than the groove portion and the gate insulating film.

Figure 1:
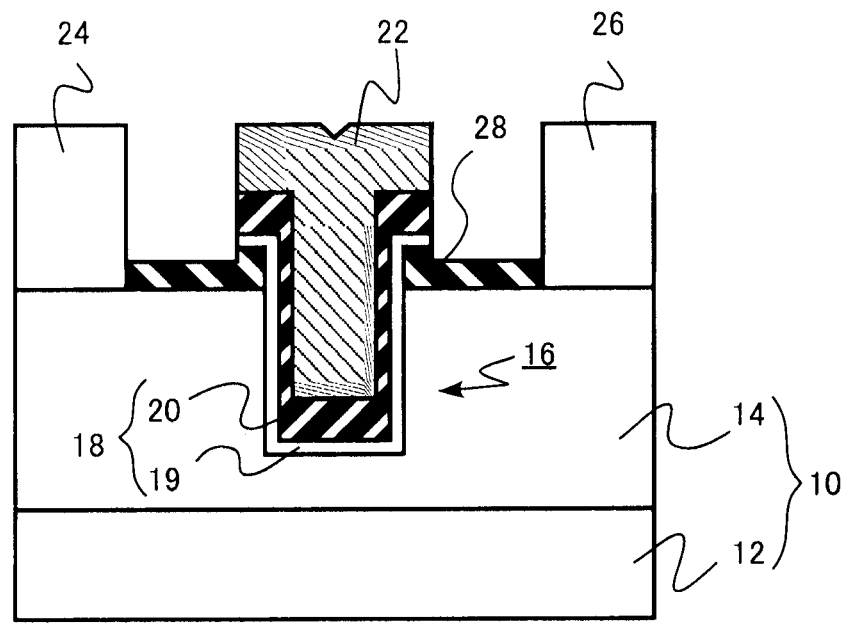
FIG. 1 is a cross-sectional view illustrating a structure of a semiconductor device of a first embodiment.

FIG. 1 is a cross-sectional view illustrating a structure of a nitride-based semiconductor device of this embodiment. The semiconductor device is formed on a semiconductor layer 10 including the III-V group nitride semiconductor. The semiconductor layer 10 is obtained by laminating a barrier layer 14 including any of GaN, AlGaN, and InAlN or combination thereof, for example, on an operation layer 12 including GaN, for example. A heterojunction interface is formed between the operation layer 12 and the barrier layer 14. For example, a film thickness of the operation layer 12 is 1 μm and the film thickness of the barrier layer 14 is 30 nm.

In this embodiment, an example of a high electron mobility transistor (HEMT) being a field-effect transistor using heterojunction of two semiconductor layers is described. However, a structure of this embodiment may also be applied to the semiconductor layer having various layer structures in addition to a two-layer structure. The HEMT using the heterojunction as in this embodiment has high channel mobility, so that this is suitable for high-frequency operation.

A groove portion 16 is formed on or in the barrier layer 14 of the semiconductor layer 10. That is, the barrier layer 14 has a concave recess structure. A gate insulating film 18 is formed at least on the bottom surface of the groove portion 16.

The gate insulating film 18 is the stacked film of a first insulating film 19 and a second insulating film 20 of which dielectric constant is higher than that of the first insulating film 19. The first insulating film 19 is formed of silicon nitride, for example. The second insulating film 20 has the dielectric constant higher than that of the barrier layer 14. As the second insulating film 20 being a high-dielectric-constant insulating film, AlN, $Al_2O_3$, $HfO_2$, $Ta_2O_5$, and $ZrO_2$ or combination thereof may be used, for example.

A gate electrode 22 is formed on the gate insulating film 18. The gate electrode 22 is formed of metal such as Ni and Ti, for example. In this manner, the semiconductor device of this embodiment is provided with a so-called recessed gate structure.

A source electrode 24 and a drain electrode 26 are formed on the semiconductor layer 10 across the gate electrode 22.

The source electrode 24 and the drain electrode 26 are formed of metal of which principal component is Al, for example.

A high-dielectric-constant second insulating film 20 is selectively formed only under the gate electrode 22. That is, it is configured such that the high-dielectric-constant second insulating film 20 is not present in a region between the gate electrode 22 and the source electrode 24 and a region between the gate electrode 22 and the drain electrode 26. Especially, it is configured such that the high-dielectric-constant second insulating film 20 is not at all present in a region between an edge portion of the gate electrode 22 and the source electrode 24 and a region between the edge portion of the gate electrode 22 and the drain electrode 26.

Further, a third insulating film 28 is formed between the surface of the semiconductor layer 10 other than the groove portion 16 and the second insulating film 20. That is, in a fringe portion of the gate electrode 22 opposed to the groove portion 16, a structure is such that the third insulating film 28 is sandwiched between the high-dielectric-constant second insulating film 20 and the semiconductor layer 10. The third insulating film 28 is formed of the silicon nitride, for example.

It is desirable to decrease a gate length of the gate electrode for allowing the HEMT to perform the high-frequency operation. However, when the gate length is not larger than 200 nm, for example, the gate length is not larger than 10 times the film thickness of the barrier layer 14. Therefore, gate controllability is deteriorated, a short channel effect occurs, and high-frequency operation characteristics are deteriorated.

Then, by forming the recess structure on the barrier layer 14 under the gate electrode 22 as in this embodiment, it is possible to bring the gate electrode 22 closer to a channel formed on an interface between the operation layer 12 and the barrier layer 14. As a result, the gate controllability may be improved. Therefore, it becomes possible to suppress the short channel effect and this is advantageous for the high-frequency operation.

When the recess structure is provided with a small gate length so as to be advantageous for the high-frequency operation, the gate electrode 22 become closer to the channel formed on the interface between the operation layer 12 and the barrier layer 14. Therefore, increase of a gate leakage current and degradation of high-frequency characteristics may occur. Therefore, it is effective to form the gate insulating film 18 under the gate electrode 22 such that the gate electrode 22 does not directly come in contact with the barrier layer 14 as in this embodiment to suppress the leak current.

When the gate insulating film is formed under the gate electrode 22, from a viewpoint of the gate controllability, it is effective to use the insulating film having the high dielectric constant as the gate insulating film 18. Therefore, by forming the second insulating film 20 in the groove portion 16 of the recess structure using the high-dielectric-constant insulating film of which dielectric constant is higher than that of the barrier layer 14 as in this embodiment, it is possible to ensure the film thickness necessary for suppressing the leakage current.

On the other hand, it is necessary to use the insulating film with a low interface state between the barrier layer 14 and the gate insulating film as the gate insulating film in order to suppress degradation in the gate controllability and reliability. Therefore, by forming the first insulating film 19 with the low interface state between the same and the barrier layer 12 as a lower layer of the gate insulating film 18 and using the second insulating film 20 being the high-dielectric-constant insulating film as an upper layer thereof as in this embodiment, it becomes possible to suppress the gate leakage current without the degradation in the high-frequency characteristics and the reliability.

For the above-described purpose, the dielectric constant of the first insulating film 19 may be smaller than that of the barrier layer 14. Also, when the nitride semiconductor is used as the semiconductor layer 10, it is desirable to use the silicon nitride with the low interface state between the same and the nitride semiconductor as the first insulating film 19.

Also, it is important not to increase capacity between the gate electrode 22 and the source electrode 24 and the capacity between the gate electrode 22 and the drain electrode 26, and it is especially important not to increase the capacity between the gate electrode 22 and the drain electrode 26 in order to improve the high-frequency characteristics.

In this embodiment, the high-dielectric-constant second insulating film 20 is selectively formed only under the gate electrode 22. That is, since the second insulating film 20 being the high-dielectric-constant insulating film is not formed between the gate electrode 22 and the drain electrode 26, the capacity between the gate and the drain is small. Therefore, this is suitable for the high-frequency operation.

Further, in the fringe portion of the gate electrode 22 opposed to the groove portion 16, the structure is such that the third insulating film 28 is sandwiched between the high-dielectric-constant second insulating film 20 and the semiconductor layer 10. Therefore, parasitic capacity between the fringe of the gate electrode 22 and the semiconductor layer 10 is decreased as compared to a case in which the third insulating film 28 is not present. Therefore, the parasitic capacity of the gate electrode 22 is further decreased and the structure is suitable for the high-frequency operation.

In this manner, according to this embodiment, it becomes possible to simultaneously satisfy suppression of the short channel effect, decrease in the gate leakage current, maintenance of high gate capacity, decrease in the interface state between the semiconductor layer and the gate insulating film, decrease in the parasitic capacity between the gate electrode and the drain electrode, and decrease in the parasitic capacity between the gate electrode and the semiconductor layer, and it is possible to provide the nitride-based semiconductor device suitable for the high-frequency operation.

Next, a gate insulating film structure desired for obtaining the above-described effect is described. In order to obtain the effect of this embodiment, it is only necessary that the capacity decreased by formation of the gate insulating film be not larger than the gate capacity improved by the recess structure.

A relational expression defining the film thickness and the dielectric constant of the first insulating film 19 and those of the second insulating film 20 being the high-dielectric-constant insulating film for this is represented. In the following equation, the thickness and the dielectric constant of the first insulating film 19 and those of the second insulating film 20 of the recess portion are set to $d_1$ and $\in_1$, and $d_2$ and $\in_2$, respectively, a depth of the groove portion 16 of the recess structure is set to $d_s$, and the dielectric constant of the barrier layer 14 is set to $\in_s$. Then, a following relational expression is obtained from a relationship necessary for the capacity of the first insulating film 19 and that of the second insulating film 20 present in a recess portion in a direction perpendicular to a surface of the barrier layer 14 and the capacity of the barrier layer 14 corresponding to the recess portion.

$$d_1 < \varepsilon_1 \left( \frac{d_s}{\varepsilon_s} - \frac{d_2}{\varepsilon_2} \right)$$ (Equation)

By satisfying the above-described relational expression about the thickness of the first insulating film 19 and that of the second insulating film 20 and the recess depth, the nitride semiconductor device suitable for the high-frequency operation may be obtained.

Next, a method of manufacturing the semiconductor device of this embodiment is described. The method of manufacturing the semiconductor device of this embodiment includes a process of forming the third insulating film on the semiconductor layer of the III-V group nitride semiconductor, a process of patterning the third insulating film, a process of forming the groove portion in the semiconductor layer, a process of forming the first insulating film at least on the bottom surface of the groove portion, a process of forming the second insulating film of which dielectric constant is higher than that of the first insulating film on the first insulating film, a process of forming the gate electrode on the second insulating film, and a process of removing the first insulating film and the second insulating film of a region other than that in which the gate electrode is formed.

FIGS. 2 to 7 are process cross-sectional views illustrating the method of manufacturing the semiconductor device of this embodiment.

Figure 2:
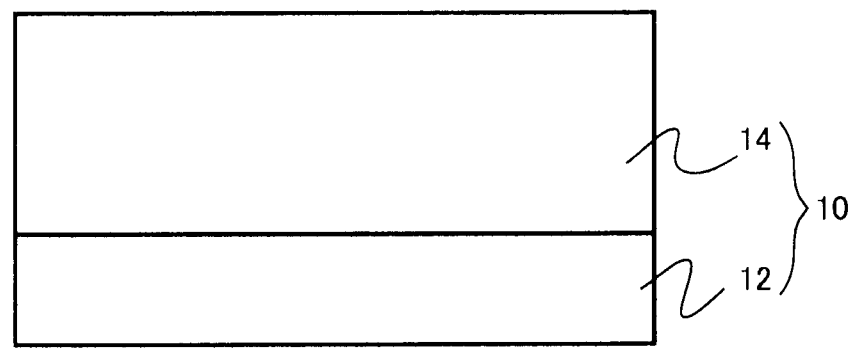
FIG. 2 is a process cross-sectional view illustrating a method of manufacturing the semiconductor device of the first embodiment.
Figure 3:
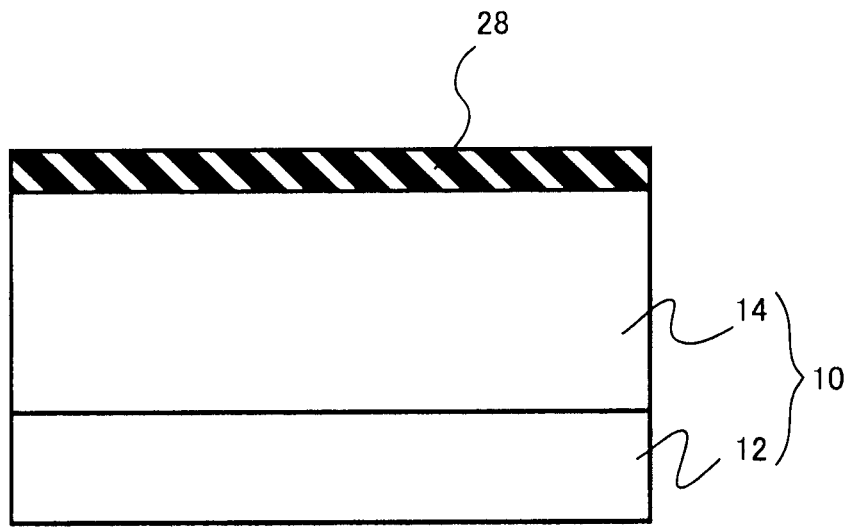
FIG. 3 is a process cross-sectional view illustrating the method of manufacturing the semiconductor device of the first embodiment.

First, the semiconductor layer 10 of the nitride semiconductor obtained by forming the barrier layer 14 on the operation layer 12 is prepared as illustrated in FIG. 2. Next, the third insulating film 28 is formed on the semiconductor layer 10 as illustrated in FIG. 3.

Figure 4:
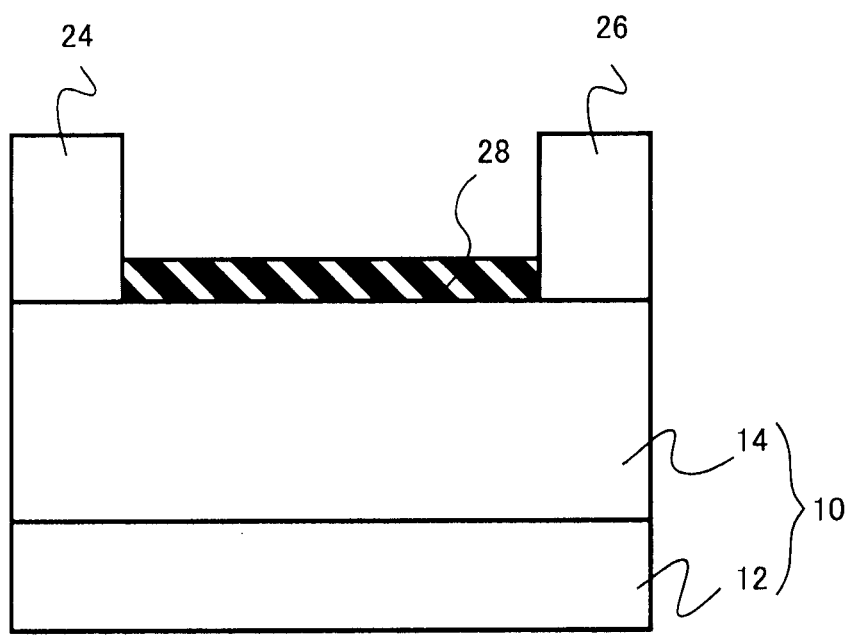
FIG. 4 is a process cross-sectional view illustrating the method of manufacturing the semiconductor device of the first embodiment.

Next, after a mask is formed using a lithography technique, the third insulating film 28 of portions on which the source electrode 24 and the drain electrode 26 are formed is removed by a reactive ion etching (RIE) technique or the like. Thereafter, the source electrode 24 and the drain electrode 26 are formed as illustrated in FIG. 4.

Figure 5:
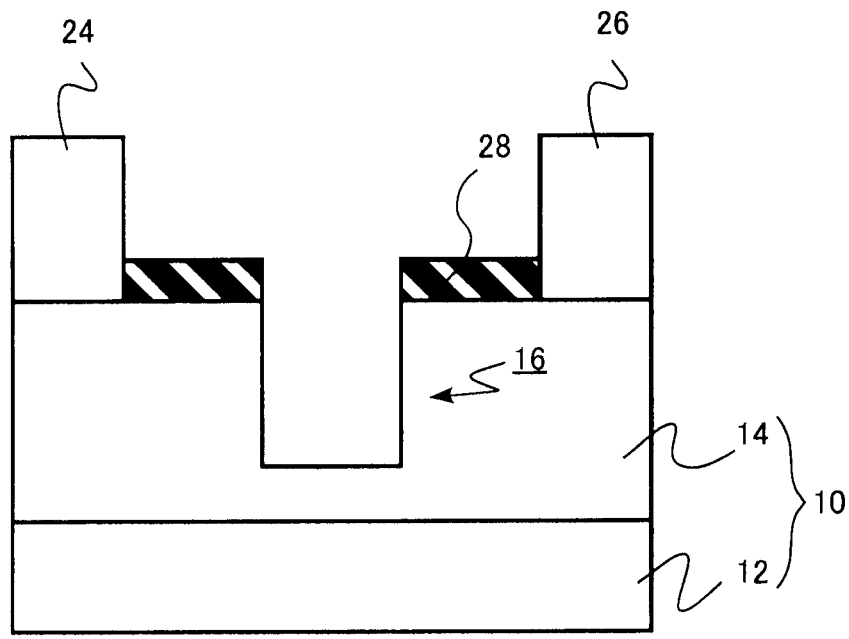
FIG. 5 is a process cross-sectional view illustrating the method of manufacturing the semiconductor device of the first embodiment.

Next, after the mask is formed using the lithography technique, it is patterned to remove the third insulating film 28 of a portion on which the gate is formed by the RIE technique or the like as illustrated in FIG. 5. Thereafter, the groove portion 16 for forming the recess structure is formed on the barrier layer 14.

Figure 6:
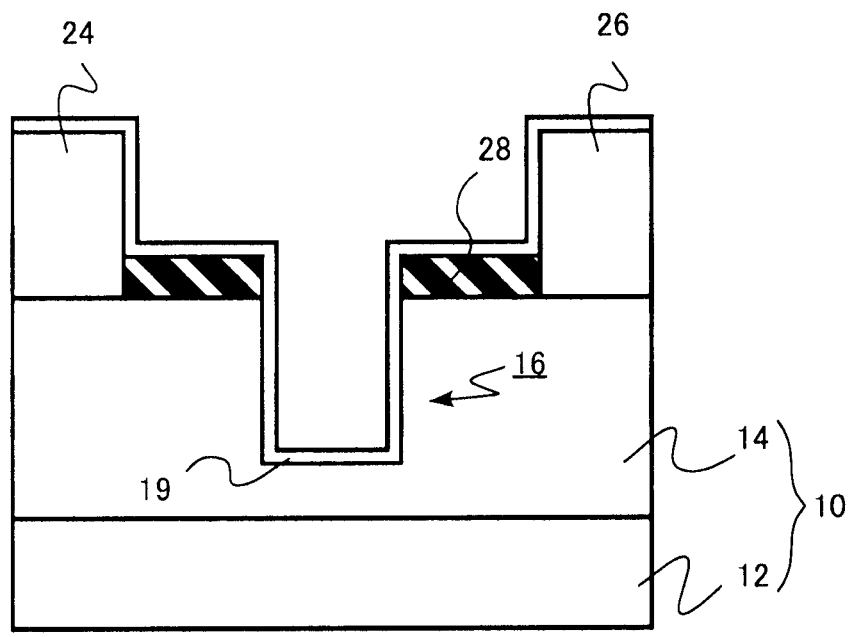
FIG. 6 is a process cross-sectional view illustrating the method of manufacturing the semiconductor device of the first embodiment.
Figure 7:
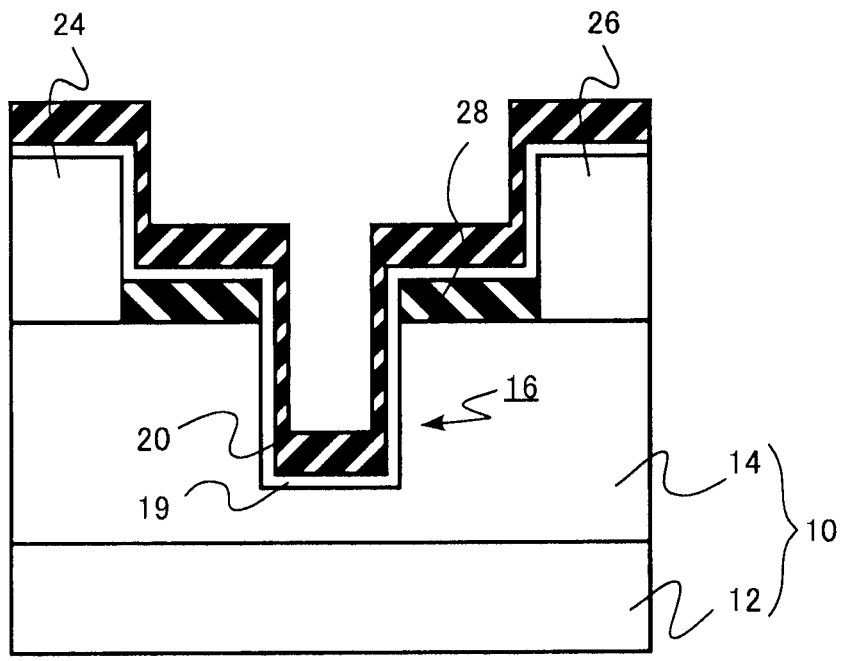
FIG. 7 is a process cross-sectional view illustrating the method of manufacturing the semiconductor device of the first embodiment.

Next, the first insulating film 19 is formed so as to entirely cover as illustrated in FIG. 6. Thereafter, the second insulating film 20 being the high-dielectric-constant insulating film is stacked on the first insulating film 19 as illustrated in FIG. 7.

Thereafter, the gate electrode 22 is formed on the second insulating film 20 and the first insulating film 19 and the second insulating film 20 being the high-dielectric-constant insulating film are removed by the RIE technique or the like with the gate electrode 22 as the mask. By the above-described processes, the semiconductor device illustrated in FIG. 1 may be manufactured.

In the above-described manufacturing method, when the first insulating film 19 is thin, a part of the third insulating film 28 on a base is also removed when the first insulating film 19 and the second insulating film 20 being the high-dielectric-constant insulating film are removed. However, the third insulating film 28 between the source electrode 24 and the gate electrode 22 and between the gate electrode 22 and the drain electrode 26 is not completely removed and a part thereof remains on the barrier layer 14.

When the first insulating film 19 and the second insulating film 20 are removed, since there is the third insulating film 28, it is possible to decrease plasma damage and the like by the RIE to the barrier layer 14. In this manner, in this embodiment, by forming the third insulating film 28 in advance, the semiconductor layer is not damaged. Therefore, it becomes possible to manufacture the semiconductor device excellent in the characteristics and the reliability and is suitable for the high-frequency operation.

Meanwhile, it is also possible to perform the process of removing the first insulating film 19 and the second insulating film 20 being the high-dielectric-constant insulating film before the process of forming the gate electrode 22.

Second Embodiment

Figure 8:
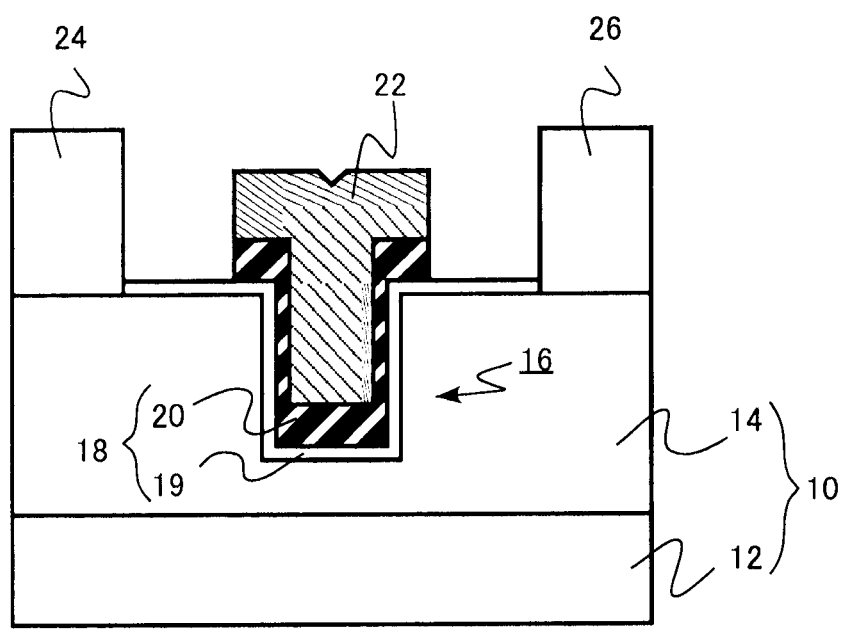
FIG. 8 is a cross-sectional view illustrating the structure of a semiconductor device of a second embodiment.

FIG. 8 is a cross-sectional view illustrating the structure of the nitride-based semiconductor device of this embodiment. The semiconductor device of this embodiment is similar to that of the first embodiment except that, although the first insulating film 19 is present, the third insulating film 28 is not present in the region between the gate electrode 22 and the source electrode 24 and the region between the gate electrode 22 and the drain electrode 26. Therefore, the description of the contents overlapping with those of the first embodiment will not be repeated.

In this embodiment, when the second insulating film 20 is removed, a removal process with high selectivity over the first insulating film 19 is necessary. However, it becomes possible to realize the semiconductor device suitable for the high-frequency operation by a simpler process by omitting the third insulating film 28.

Third Embodiment

Figure 9:
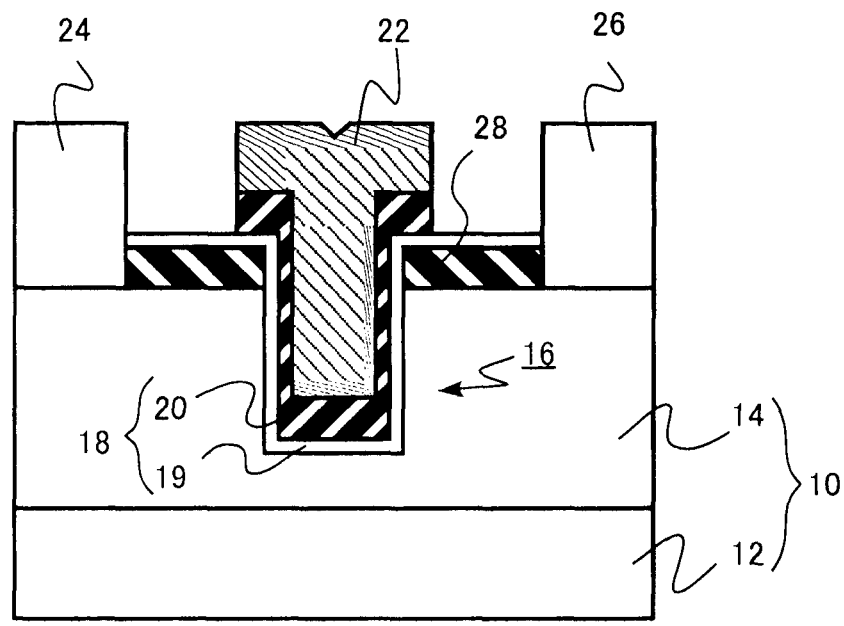
FIG. 9 is a cross-sectional view illustrating the structure of a semiconductor device of a third embodiment.

FIG. 9 is a cross-sectional view illustrating the structure of the nitride-based semiconductor device of this embodiment. The semiconductor device of this embodiment is similar to that of the first embodiment except that the first insulating film 19 is present in the region between the gate electrode 22 and the source electrode 24 and the region between the gate electrode 22 and the drain electrode 26. Therefore, the description of the contents overlapping with those of the first embodiment will not be repeated.

It becomes possible to realize the semiconductor device suitable for the high-frequency operation also in this embodiment.

Fourth Embodiment

Figure 10:
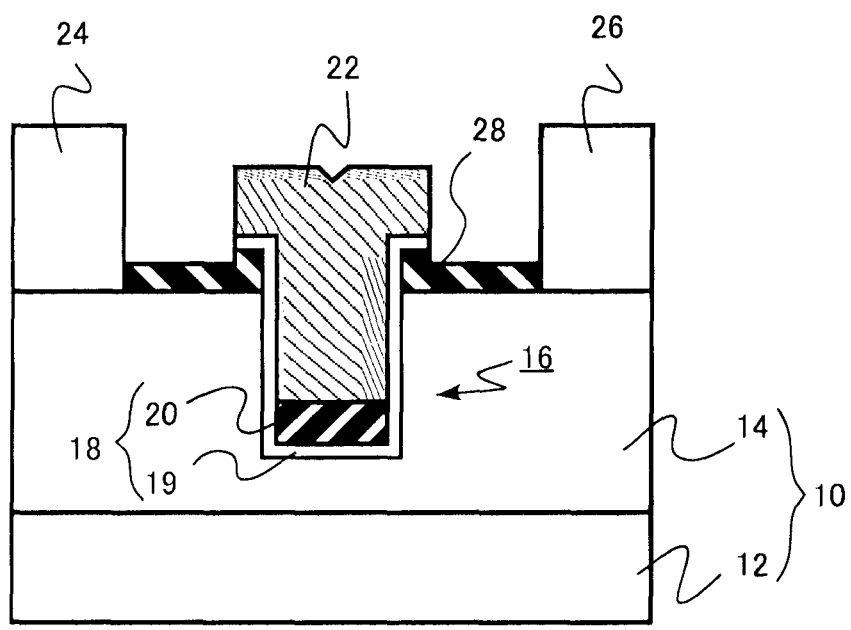
FIG. 10 is a cross-sectional view illustrating the structure of a semiconductor device of a fourth embodiment.

FIG. 10 is a cross-sectional view illustrating the structure of the nitride-based semiconductor device of this embodiment. The semiconductor device of this embodiment is similar to that of the first embodiment except that the high-dielectric-constant second insulating film 20 is present only on the bottom surface of the groove portion 16 of the recess structure. Therefore, the description of the contents overlapping with those of the first embodiment will not be repeated.

It becomes possible to realize the semiconductor device suitable for the high-frequency operation also in this embodiment. Meanwhile, the structure in FIG. 10 may be manufactured by forming the second insulating film 20 being the high-dielectric-constant insulating film by selecting a deposition method with high verticality such as sputtering, for example, in the manufacturing method described in the first embodiment.

Fifth Embodiment

Figure 11:
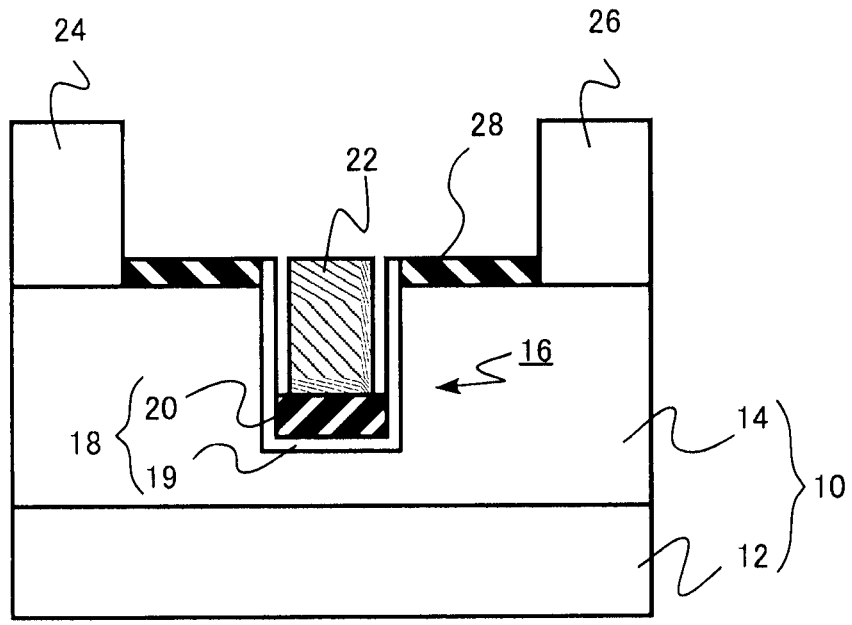
FIG. 11 is a cross-sectional view illustrating the structure of a semiconductor device of a fifth embodiment.

FIG. 11 is a cross-sectional view illustrating the structure of the nitride-based semiconductor device of this embodiment. The semiconductor device of this embodiment is different from that of the first embodiment in that the high-dielectric-constant second insulating film 20 is present only on the bottom surface of the groove portion 16 of the recess structure and a space is present between the first insulating film 19 and the gate electrode 22. The description of the contents overlapping with those of the first embodiment will not be repeated.

According to this embodiment, it is possible to decrease the parasitic capacity between the gate electrode 22 and the barrier layer 14 on a side surface of the groove portion 16 by providing the space between the first insulating film 19 and the gate electrode 22. Therefore, it becomes possible to realize the semiconductor device more suitable for the high-frequency operation.

In this embodiment, it is possible to freely select whether the gate electrode 22 fits in the groove portion 16 or, the gate electrode 22 protrudes out of the groove portion 16 and the fringe portion is provided.

Sixth Embodiment

Figure 12:
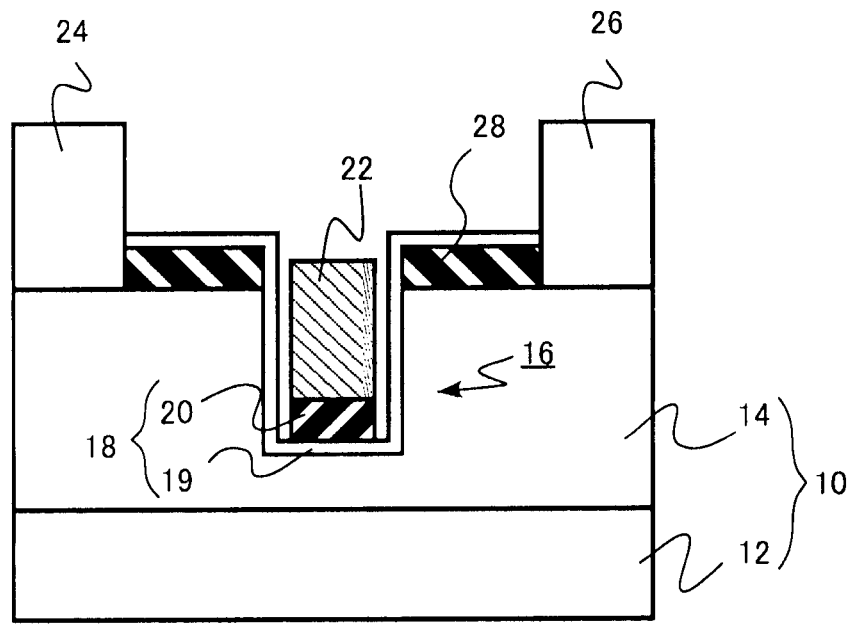
FIG. 12 is a cross-sectional view illustrating the structure of a semiconductor device of a sixth embodiment.

FIG. 12 is a cross-sectional view illustrating the structure of the nitride-based semiconductor device of this embodiment. The semiconductor device of this embodiment is different from that of the first embodiment in that the high-dielectric-constant second insulating film 20 is present only on the bottom surface of the groove portion 16 of the recess structure and the space is present between the first insulating film 19 and the gate electrode 22 and between the first insulating film 19 and the second insulating film 20 on a side portion of the groove portion 16. The description of the contents overlapping with those of the first embodiment will not be repeated.

According to this embodiment, it is possible to decrease the parasitic capacity between the gate electrode 22 and the barrier layer 14 on the side surface of the groove portion 16 by providing the space between the first insulating film 19 and the gate electrode 22. Therefore, it becomes possible to realize the semiconductor device more suitable for the high-frequency operation.

Seventh Embodiment

Figure 13:
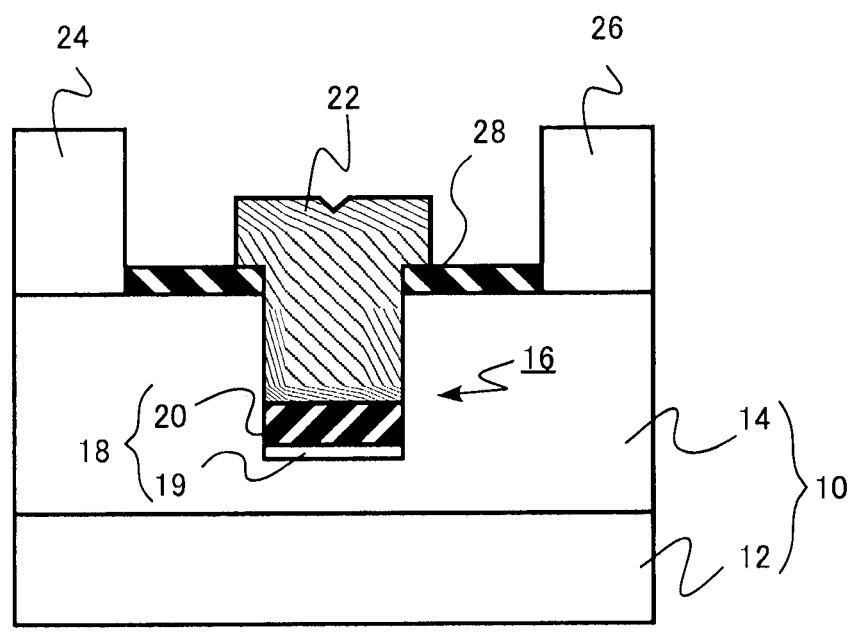
FIG. 13 is a cross-sectional view illustrating the structure of a semiconductor device of a seventh embodiment.

FIG. 13 is a cross-sectional view illustrating the structure of the nitride-based semiconductor device of this embodiment. The semiconductor device of this embodiment is different from that of the first embodiment in that the first insulating film 19 and the high-dielectric-constant second insulating film 20 are not formed on the side surface of the groove portion 16 of the recess structure. The description of the contents overlapping with those of the first embodiment will not be repeated.

It becomes possible to realize the semiconductor device suitable for the high-frequency operation also in this embodiment.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor layer including a III-V group nitride semiconductor;
   a groove portion formed in the semiconductor layer;
   a gate insulating film formed at least on a bottom surface of the groove portion, the gate insulating film being a stacked film of a first insulating film and a second insulating film, a dielectric constant of second insulating film is higher than a dielectric constant of the first insulating film;
   a gate electrode formed on the gate insulating film;
   a third insulating film formed between a surface of the semiconductor layer other than the groove portion and the second insulating film; and
   a source electrode and a drain electrode formed on the semiconductor layer, the source electrode and the drain electrode interposing the gate electrode in between,
   wherein the second insulating film is selectively formed only under the gate electrode.

2. The device according to claim 1, wherein the first insulating film is formed of silicon nitride.

3. The device according to claim 1, wherein the semiconductor layer includes a stacked structure of an operation layer including GaN and a barrier layer including any of AlGaN, GaN, and InAlN or combination thereof formed on the operation layer.

4. The device according to claim 1, the device satisfies a relationship of the following equation when a thickness and the dielectric constant of the first insulating film of the groove portion are set to $d_1$ and $\varepsilon_1$, a thickness and the dielectric constant of the second insulating film of the groove portion are set to $d_2$ and $\varepsilon_2$, and a thickness of the semiconductor layer corresponding to a depth of the groove portion and a dielectric constant of the semiconductor layer are set to $d_s$ and $\varepsilon_s$;

$$d_1 < \varepsilon_1 \left( \frac{d_s}{\varepsilon_s} - \frac{d_2}{\varepsilon_2} \right). \quad \text{(Equation)}$$

5. The device according to claim 1, wherein the second insulating film is formed of AlN, $Al_2O_3$, $HfO_2$, $Ta_2O_5$, and $ZrO_2$ or combination thereof.

6. The device according to claim 1, wherein the third insulating film is formed of silicon nitride.

* * * * *